(12) United States Patent
Kawaguchi

(10) Patent No.: US 9,992,919 B2
(45) Date of Patent: Jun. 5, 2018

(54) ELECTRONIC CIRCUIT COMPONENT MOUNTING SYSTEM

(71) Applicant: FUJI MACHINE MFG. CO., LTD., Chiryu (JP)

(72) Inventor: Koji Kawaguchi, Kasugai (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 209 days.

(21) Appl. No.: 14/779,466

(22) PCT Filed: Mar. 26, 2013

(86) PCT No.: PCT/JP2013/058818
§ 371 (c)(1),
(2) Date: Sep. 23, 2015

(87) PCT Pub. No.: WO2014/155535
PCT Pub. Date: Oct. 2, 2014

(65) Prior Publication Data
US 2016/0037694 A1 Feb. 4, 2016

(51) Int. Cl.
*B23P 19/00* (2006.01)
*H05K 13/08* (2006.01)
(Continued)

(52) U.S. Cl.
CPC ......... *H05K 13/08* (2013.01); *H01L 21/6838* (2013.01); *H01L 24/75* (2013.01); *H05K 13/0408* (2013.01); *H05K 13/0413* (2013.01)

(58) Field of Classification Search
CPC .... H05K 13/0417; H05K 13/08; H05K 3/301; H05K 13/0413; H05K 13/0408; H01L 24/75; H01L 21/6838
See application file for complete search history.

(56) References Cited

U.S. PATENT DOCUMENTS 4,964,211 A  10/1990 Arao et al.
7,065,864 B2 * 6/2006 Yamamoto ......... H05K 13/0413
                                                   29/712
(Continued)

FOREIGN PATENT DOCUMENTS

JP       09001430 A   *  1/1997
JP      2005-19957 A      1/2005
JP     2011-187831 A      9/2011

OTHER PUBLICATIONS

Extended European Search Report dated Oct. 6, 2016 in Patent Application No. 13879683.4.
(Continued)

*Primary Examiner* — Paul D Kim
(74) *Attorney, Agent, or Firm* — Oblon, McClelland, Maier & Neustadt, L.L.P.

(57) ABSTRACT

An electronic circuit component mounting machine including a suction nozzle lowered by a first linear motor and a second linear motor by two stages A drive circuit of the second linear motor includes a reaction force detecting section and a damage detecting section that detects damage of an electronic circuit component. A controller that controls the drive circuit includes an appropriate operation parameter determining section that determines an appropriate value of an operation parameter of the second linear motor using the reaction force detecting section and the damage detecting section.

10 Claims, 8 Drawing Sheets

(51) Int. Cl.
    *H01L 23/00*    (2006.01)
    *H05K 13/04*    (2006.01)
    *H01L 21/683*   (2006.01)

(56) References Cited

U.S. PATENT DOCUMENTS

| | | | | |
|---|---|---|---|---|
| 8,881,383 | B2* | 11/2014 | Kitagawa | H05K 13/0452 29/469 |
| 8,881,384 | B2* | 11/2014 | Kitagawa | H05K 13/0413 29/469 |
| 8,950,064 | B2* | 2/2015 | Kitagawa | H05K 13/0452 29/469 |
| 2012/0179391 | A1* | 7/2012 | Omori | H05K 1/0268 702/35 |

OTHER PUBLICATIONS

Office Action dated Oct. 4, 2016 in Japanese Patent Application No. 2015-507745 (with unedited computer generated English translation).

International Search Report dated Jul. 2, 2013 in PCT/JP2013/058818 filed Mar. 26, 2013.

* cited by examiner (a)

(b)

(a)

(b)

ELECTRONIC CIRCUIT COMPONENT MOUNTING SYSTEM

TECHNICAL FIELD

The present disclosure relates to a component mounting system that mounts an electronic circuit component (hereinafter referred to as a component as long as there is no particular requirement) held by a component holding tool on a mounting target member held by a target member holding device. In component mounting systems, in some cases, to perform mounting, the component holding tool such as a suction nozzle is lowered by a holding tool lifting and lowering device, thereby causing the holding tool to contact a component supplied from a component supplying device, or thereby causing a component held by the component holding tool to contact a mounting target member, but in this type of component mounting system, the component can be damaged during the above contact. The present disclosure relates to the detection of damage to the component and the prevention of damage to the component.

BACKGROUND ART

In recent years, further miniaturization of electronic circuits has been required, and in order to meet this requirement, a component-embedded printed circuit board in which components are embedded in a circuit board with a plurality of layers has been manufactured, for example, as described in PTL 1 below. In the component-embedded printed circuit board, in order to make the entire board thin, making a circuit board and components thin is attempted, but it is necessary to ensure electrical characteristics despite being thin, and thus a hard member such as a wafer is frequently used as a material. In addition, in order to achieve further miniaturization, an attempt is made to not only make a passive component, such as a resistor, a capacitor or the like, be thin, but to also make an active component, such as an IC be thin, and manufacture of a stacked printed circuit board in which thin components (components that should be respectively referred to as an electronic circuit) are stacked is also performed. In the stacked printed circuit boards that are currently manufactured, in some cases stacked printed circuit boards are connected to each other by wire bonding, but research into stacked CPUs in which a CPU and a memory are stacked and which are connected by a through-silicon via (TSV) in the inside of the stacked printed circuit board is also being performed.

CITATION LIST

Patent Literature

PTL 1: JP-A-2011-187831

However, a hard and thin material is brittle, and when a component holding tool contacts a component, or when a component held by a component holding tool contacts a mounting target member such as a circuit board or other component, the component may be damaged. Damage may occur when manufacturing a surface mount circuit board whereby a component is mounted on a single layer circuit board, and a detection technology or a preventive technology for damage is useful here, but a detection technology or a preventive technology for damage is even more important in a component-embedded printed circuit board or a multi-layer printed circuit board. In a case in which a component is damaged when manufacturing a surface mount circuit board, it is possible to perform repair, such as replacing the component with another component, but it is substantially impossible to repair a component-embedded printed circuit board or a multi-layer printed circuit board, and furthermore, a component such as an IC is expensive in most cases, thereby great loss occurs, thus it is even more important. However, a component mounting system which can detect component damage is not described in PTL1 or in other patent documents.

Meanwhile, in order to prevent the damage of a component, component manufacturers publicize the maximum recommended value of a contact force that is applied to a component during mounting, but even if parameters of a mounting operation are determined in accordance with the recommended value, damage may still occur. The assumed reason is that the conditions under which the component manufacturer determines the recommended value are different from the conditions under which a component is actually mounted on a mounting target member. In addition, it is assumed that the structure and so on of the mounting system has an influence, and if the structures of the mounting systems are different from each other, it is assumed that parameters of the mounting operation should be modified. Furthermore, when a component manufacturer determines the recommended value of the contact force, a predetermined margin is likely added, and it is assumed that when a component user determines the operation parameters, a certain magnitude of margin is added as well; as a result, the added margin is in many cases excessive, meaning that the manufacturing efficiency of an electronic circuit may be suppressed lower than necessary. In order to suppress the upper limit of the contact force which is applied to a component during mounting, there are means for decreasing the set weight or the elastic coefficient of a compression coil spring that functions as a cushion, but in the end, it is necessary to decrease the lowering speed of the component holding tool.

BRIEF SUMMARY

Technical Problem

An object of the present disclosure is to solve the problems described above.

Solution to Problem

The object is achieved by providing an electronic circuit component mounting system comprising (a) an electronic circuit component supplying device that supplies an electronic circuit component, (b) a target member holding device that holds a mounting target member to which the electronic circuit component is to be mounted, (c) amounting device that includes a component holding tool which holds the electronic circuit component and a lifting and lowering device which lifts and lowers the component holding tool, receives the electronic circuit component from the component supplying device using the component holding tool, and mounts the electronic circuit component to the mounting target member held by the target member holding device, and (d) a damage detecting device that detects that the electronic circuit component is damaged in at least one of when the component holding tool contacts the electronic circuit component by the component holding tool being lowered by the lifting and lowering device, and when the electronic circuit component held by the component holding tool contacts the mounting target member by the component holding tool being lowered by the lifting and lowering device.

The object is also achieved by providing an electronic circuit component mounting system including the above (a) component supplying device, (b) target member holding device, (c) mounting device, and (d) damage detecting device, and further including (e) a damage operation parameter acquiring section that acquires an operation parameter as a damage operation parameter in a case in which damage of an electronic circuit component is detected by the damage detecting device when operation of contacting the electronic circuit component held by the component holding tool against the mounting target member held by the target member holding device is repeatedly performed while changing, in accordance with a predetermined rule, an operation parameter which is the parameter for the operation of contacting the electronic circuit component against the mounting target with respect to one set of the target member holding device, the electronic circuit component, and the mounting target.

The object is also achieved by providing an electronic circuit component mounting system including the above (a) component supplying device, (b) target member holding device, (c) mounting device, and (d) damage detecting device, and further including (e) a damage operation parameter acquiring section that acquires an operation parameter for a case in which damage of an electronic circuit component is detected by the damage detecting device when operation of contacting the component holding tool against the electronic circuit component held by the component supply device is repeatedly performed while changing, in accordance with a predetermined rule, the operation parameter which is the parameter for the operation of contacting the component holding tool against the electronic circuit component with respect to one set of a component supply device and an electronic circuit component.

The above rule for changing the operation parameter may be a rule that changes the parameter from that for which breaking an electronic circuit component is difficult to that for which breaking an electronic circuit component is easy, or it may be a rule that changes the parameter in the opposite direction, but the former is preferable due to fewer electronic circuit components being damaged.

If a damage operation parameter is obtained, based on this, it is also possible to obtain a boundary operation parameter that is an operation parameter which is the boundary between a case in which the damage is detected and a case in which the damage is not detected. It is preferable that the boundary operation parameter is automatically obtained, but it is not essential, and the boundary operation parameter may also be obtained by a person.

Advantageous Effects

If a component is damaged during mounting work, an electronic circuit component mounting system that includes a damage detecting device immediately detects the damage. Thus, in a case in which damage is detected during manufacture of a component-embedded printed circuit board or a stacked printed circuit board, it is possible to immediately stop the mounting work at that time. With the previous art, damage of a component is first found through electrical inspection after the component-embedded printed circuit board or the stacked printed circuit board has been completed, and thus repair cannot be done by the time damage is found, and since many components are integrated, loss is significant. In contrast to this, if damage is immediately found, repair is done if possible, and even in a case in which repair cannot be done, mounting work is stopped thereafter, and thus it is possible to reduce waste of components or time as much as possible. Particularly, the effect is greater when manufacturing component-embedded printed circuit boards or stacked printed circuit boards, but it is also advantageous when manufacturing surface mount printed circuit boards.

In addition, according to the electronic circuit component mounting system that includes a damage operation parameter acquiring section in addition to the damage detecting device, it is possible to acquire the damage operation parameter under the same conditions as when actually manufacturing a circuit board. It is possible to acquire a boundary operation parameter that is an operation parameter which is the boundary between a case in which the damage is detected and a case in which the damage is not detected based on the damage operation parameter, and it is possible to efficiently manufacture a circuit board using an appropriate operation parameter to which an appropriate margin has been added. Moreover, the damage detecting device can function even during actual manufacture of the circuit board, and in this case, if damage occurs, the damage can be detected, thus the margin can be set to a relatively small value, and it is possible to more efficiently manufacture the circuit board.

BRIEF DESCRIPTION OF DRAWINGS

FIG. 3A is a partial sectional front view, and FIG. 3B is a view taken along an arrow A of FIG. 3 (a).

DETAILED DESCRIPTION

Hereinafter, embodiments of the present disclosure will be described with reference to the drawings. In addition to the following embodiments, the present disclosure can be embodied with various modifications based on knowledge of those skilled in the art.

Figure 1:
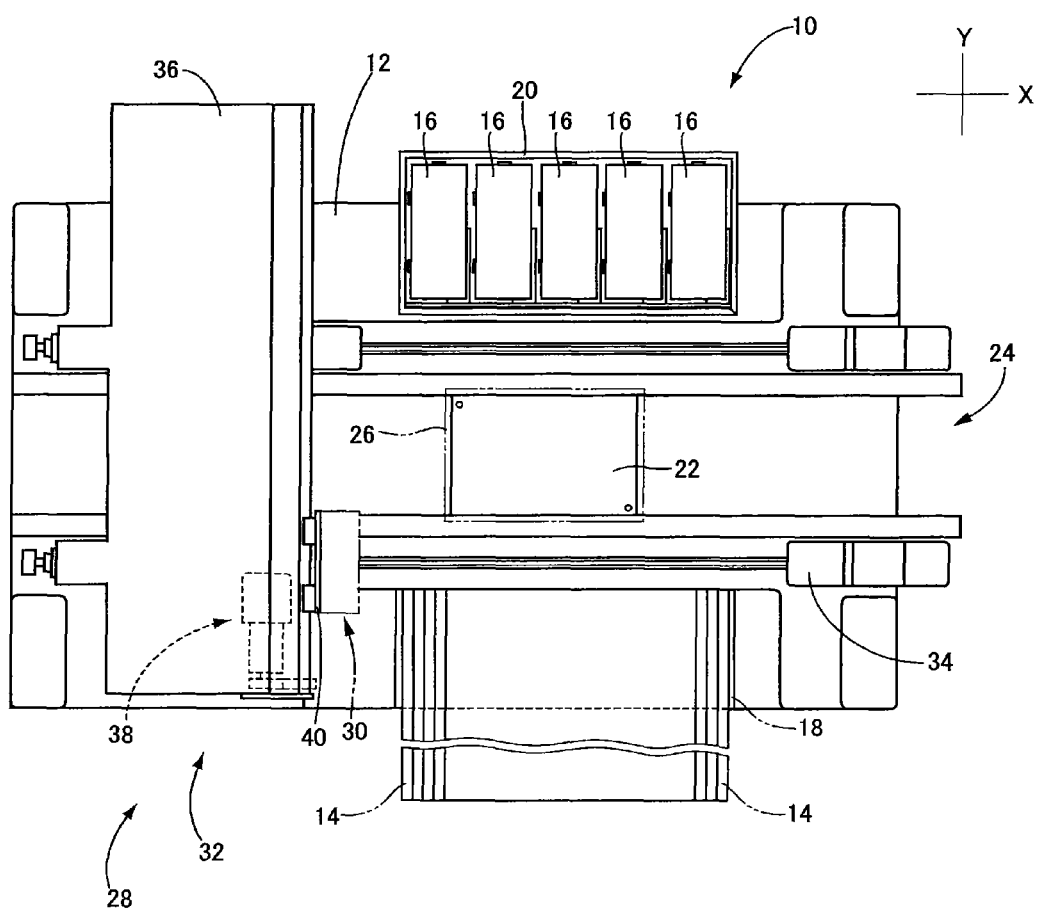
FIG. 1 is a plan view illustrating an electronic circuit component mounting machine that is a main portion of an electronic circuit component mounting system according to an embodiment of the present disclosure.

FIG. 1 illustrates an electronic circuit component mounting machine 10 that is a main portion of an electronic circuit component mounting system. Hereinafter, the electronic circuit component mounting system and the electronic circuit component mounting machine 10 are respectively referred to as a mounting system and a mounting machine 10. The mounting machine 10 includes a mounting machine main body 12, and tape feeders 14 and tray feeders 16 which are component supplying devices that are supported by the mounting machine main body 12. Each of the tape feeders 14 draws a holding tape that holds one type of component such that the components can be taken out one at a time from a reel, moves the holding tape by one pitch at a time, and supplies the holding tape to a predetermined position; and the tape feeders 14 are installed on a support table 18 in parallel with each other in the X direction. The tray feeders 16 position and support components in trays in parallel with each other in a plane, and are also installed on a support table 20 in parallel with each other in the X direction.

Furthermore, a target member conveyor 24 that transports a mounting target member 22 such as a circuit board, an electronic circuit or the like in the X direction, a target member holding device 26 that positions and holds the transported mounting target member 22, and a mounting device 28 that receives a component from the tape feeder 14 or the tray feeder 16 and mounts the component to the mounting target member 22 which is held in the target member holding device 26, are provided on the mounting machine main body 12. The mounting device 28 includes a mounting head 30, and a head moving device 32 that can move the mounting head 30 to any position on a horizontal plane defined by an X axis and a Y axis. The head moving device 32 includes an X slide 36 that is moved by an X axis drive device 34 in the X axis direction on the mounting machine main body 12, and a Y slide 40 that is moved by a Y axis drive device 38 in the Y axis direction on the X slide 36, and the mounting head 30 can be attached to and detached from the Y slide 40.

Figure 2:
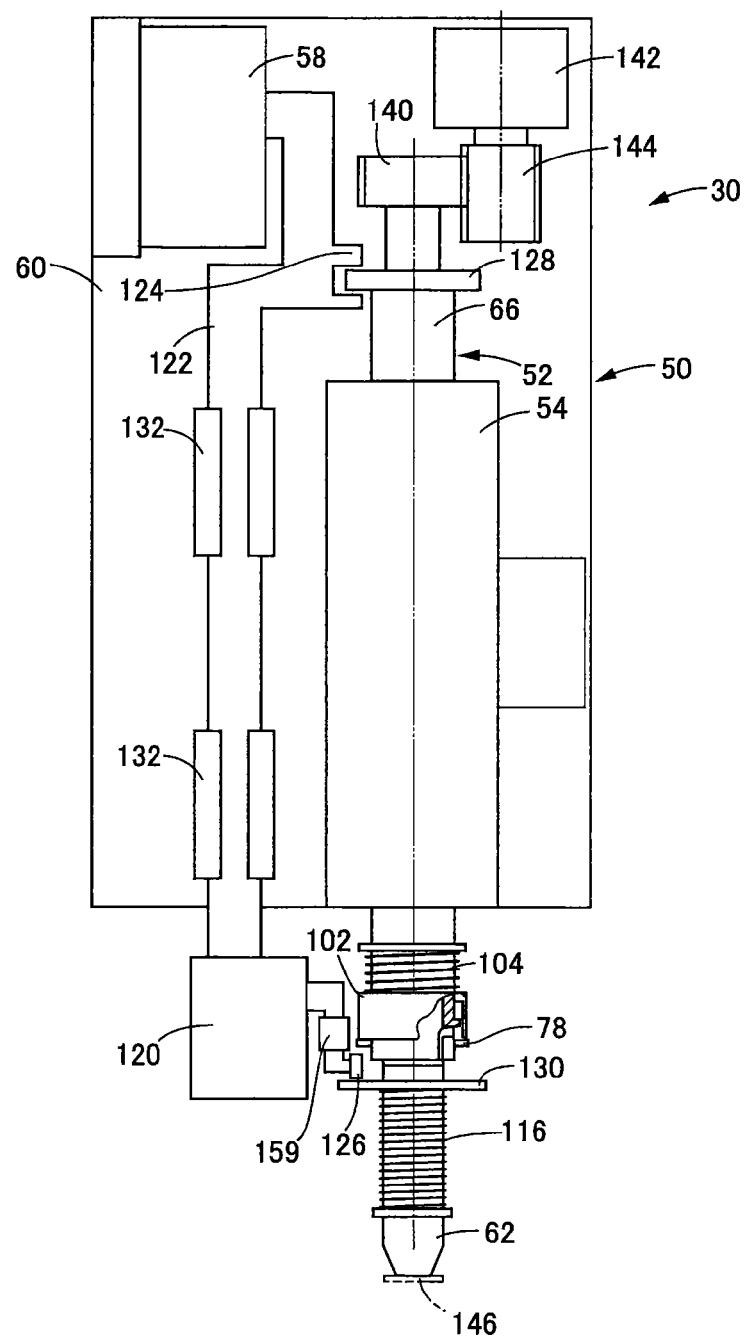
FIG. 2 is a front view illustrating an example of a mounting head of the electronic circuit component mounting machine.
Figure 3:
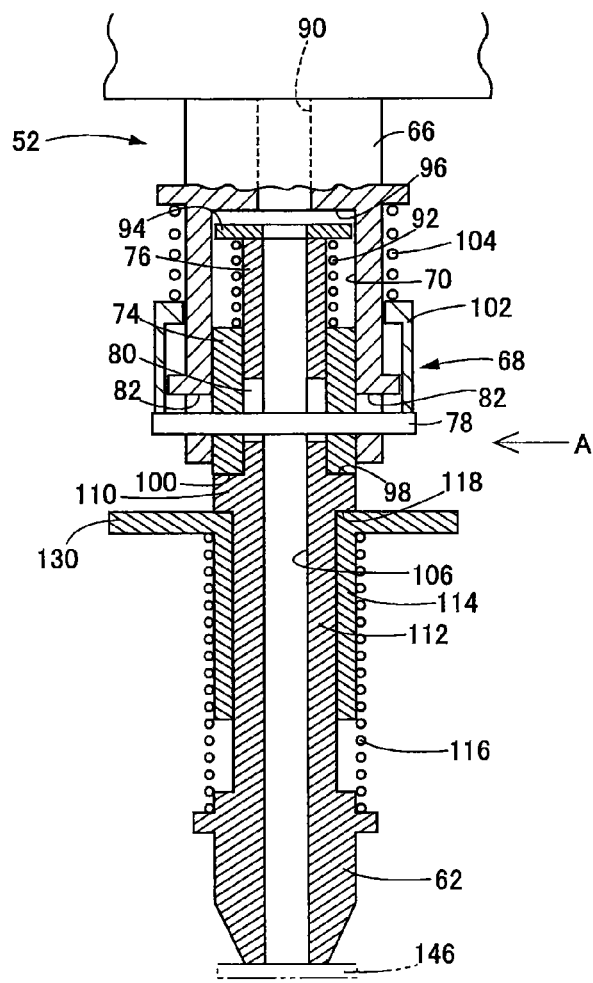
FIG. 3A and FIG. 3B are views illustrating a suction nozzle of the mounting head and periphery thereof.
Figure 3:
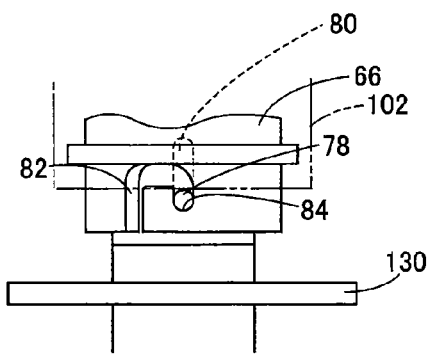

An example of the mounting head 30 is illustrated in FIG. 2. The mounting head 30 includes a head body 50 that is attached to or detached from the Y slide 40. The head body 50 includes a first section 54 that holds a rotational lifting and lowering shaft 52 in a state in which lifting and lowering in a direction parallel with an axis line of the rotational lifting and lowering shaft 52 and rotation around the axis line is allowed, and a second section 60 that fixedly holds a first linear motor 58. In the present embodiment, the first section 54 and the second section 60 are fixed to each other. The rotational lifting and lowering shaft 52 holds a suction nozzle 62 that is a component holding tool in a lower end portion. As illustrated in FIG. 3A in an enlarged manner, the rotational lifting and lowering shaft 52 includes a lifting and lowering shaft body 66, and a nozzle holding section 68 that can be attached to or detached from the lifting and lowering shaft body 66; the nozzle holding portion 68 is held by the lifting and lowering shaft body 66 so as to be able to relatively move the suction nozzle 62 in an axis direction and to not be able to relatively rotate the suction nozzle 62, and is attached to or detached from the lifting and lowering shaft body 66. After being mounted in the lifting and lowering shaft body 66, the nozzle holding portion 68 functions as a part of the rotational lifting and lowering shaft 52.

The lifting and lowering shaft body 66 includes a fitting hole 70 whose sectional shape is circular in a lower end portion, the nozzle holding portion 68 includes a nozzle holding member 74 of a cylindrical shape, and the outer circumferential surface of nozzle holding member 74 fits against the fitting hole 70 so as to be able to relatively rotate and relatively move in an axis direction, while inner circumferential surface of nozzle holding member 74 fits to an axis portion 76 of the suction nozzle 62 so as to be able to relatively move in an axis direction. A pin 78 that penetrates the nozzle holding member 74 in a diameter direction is fixed to the nozzle holding member 74. The pin 78 slidably penetrates a long hole 80 that is formed to be long in an axis direction of the axis portion 76 in the axis portion 76 of the suction nozzle 62 in a central portion, meanwhile both end portions of the pin 78 protrude from the outer circumferential surface of the nozzle holding member 74, slidably penetrate two notches 82 that are formed in the lower end portion of the lifting and lowering shaft body 66, and protrude from the outer circumferential surface of the lifting and lowering shaft body 66. As illustrated in FIG. 3B, after each notch 82 extends upwards from the lower end surface of the lifting and lowering shaft body 66, the notch 82 is bent perpendicular and extends to the outside, and further has a shape of shortly hanging down from the end thereof; the nozzle holding member 74 fits to the lifting and lowering shaft body 66 from a lower end opening of the fitting hole 70, lowers after being rotated by a predetermined angle, and according to this, both end portions of the pin 78 fit to the notch 82, and finally, are received to a short and hanging down pin receiving section 84 of the notch 82. In this state, the pin 78 penetrates the lifting and lowering shaft body 66, and the axis portion 76 of the nozzle holding member 74 and the suction nozzle 62, and enters a state in which tripartite relative rotation is prevented. Thus, if the rotational lifting and lowering shaft 52 is rotated, the suction nozzle 62 is also rotated.

A negative pressure path 90 is formed in the central portion of the lifting and lowering shaft body 66, and is connected to the fitting hole 70. After the axis portion 76 of the suction nozzle 62 penetrates the nozzle holding member 74, compression coil spring 92 is engaged, and a flange member 94 is fixed on an upper end of the axis portion 76. As described above, in a state in which the nozzle holding member 74 is fit to the fitting hole 70 and the pin 78 is received to the pin receiving section 84, the flange member 94 is separated from a stepped surface 96 that is formed at the boundary between the fitting hole 70 and the negative pressure path 90; meanwhile a stepped surface 98 of the suction nozzle 62 is held in a state of being pressed to a lower end surface 100 of the nozzle holding member 74. The lower end surface 100 configures a stopper that defines a relative rising limit of the suction nozzle 62 with respect to the lifting and lowering shaft body 66. As described above, since the negative pressure path 90 is connected to the fitting hole 70, if negative pressure is supplied to the negative pressure path 90, force that draws the suction nozzle 62 and the nozzle holding member 74 upward is applied to the suction nozzle 62 and the nozzle holding member 74, but, in order to prevent the pin 78 from floating upwards from the pin receiving section 84 due to the force, a lock mechanism is provided. A lock sleeve 102 is slidably fit to the outer circumferential surface of the lifting and lowering shaft body 66, and presses the pin 78 to the pin receiving section 84 after being biased downwards by a compression coil spring 104. The negative pressure path 90 in the rotational lifting and lowering shaft 52 is connected to a negative pressure path 106 in the suction nozzle 62. As illustrated in FIG. 3A, the suction nozzle 62 includes a large diameter section 110 in an intermediate section in an axis direction, and a small diameter 112 that extends in a direction opposite to the axis portion 76 from the large diameter section 110, and a nozzle sleeve 114 is slidably fit to the small diameter section 112. The nozzle sleeve 114 is biased toward the base end of the suction nozzle 62 by a compression coil spring 116, and is normally in contact with a stepped surface 118.

As illustrated in FIG. 2, the first linear motor 58 functions as a first lifting and lowering drive device that lifts and lowers the rotational lifting and lowering shaft 52 which is a first lifting and lowering member and a second linear motor 120 which is a second lifting and lowering drive device. For this reason, a lifting and lowering drive member 122 that is the second lifting and lowering member is attached to the first linear motor 58. The lifting and lowering drive member 122 extends in a vertical direction on the outside of the first section 54 of the head body 50 in line with the rotational lifting and lowering shaft 52, includes a first fitting section 124 in an intermediate section, and holds the second linear motor 120 on a lower end portion. The second linear motor 120 includes a second fitting section 126 (configured from a roller which can rotate around a horizontal axis line). The first fitting section 124 is fit to a flange 128 that is provided in the vicinity of an upper end of the rotational lifting and lowering shaft 52, and the second fitting section 126 is fit to a flange 130 of the nozzle sleeve 114, in a state such that rotation of the rotational lifting and lowering shaft 52 and the suction nozzle 62 is allowed. A guide 132 is attached to the second section 60 of the head body 50, and guides the lifting and lowering drive member 122.

A gear 140 is provided above the flange 128 of the rotational lifting and lowering shaft 52, and meshes with a gear 144 fixed to a rotation shaft of an electric motor 142 that is a rotation drive source attached to the head body 50. The gears 140 and 144 transfer the rotation of the electric motor 142 to the rotational lifting and lowering shaft 52 while allowing lifting and lowering of the rotational lifting and lowering shaft 52. The rotation drive device of the rotational lifting and lowering shaft 52 is configured from the electric motor 142 and the gears 140 and 144; the rotation of the rotational lifting and lowering shaft 52 is transferred to the nozzle holding member 74 by the fitting of the pin receiving section 84 and the pin 78, and is transferred to the suction nozzle 62 by the fitting of the pin 78 and the long hole 80.

The mounting head 30 configured as described above is moved over the tape feeders 14 or the tray feeders 16 and the target member holding device 26 along an X-Y plane by the head moving device 32; the first linear motor 58 lowers the lifting and lowering drive member 122, and lowers the rotational lifting and lowering shaft 52 and the second linear motor 120. In addition, the second linear motor 120 relatively lowers the suction nozzle 62 with respect to the rotational lifting and lowering shaft 52 via the nozzle sleeve 114 and the compression coil spring 116. Furthermore, at the same time, negative pressure of the negative pressure path 90 is controlled by a negative pressure control valve that is not illustrated, such that the holding and release of a component 146 by the suction nozzle 62 is controlled. In addition, the electric motor 142 is operated if necessary, such that a rotation posture of a component that is held by the suction nozzle 62 is modified or changed. Since the control of the first linear motor 58, a negative pressure control valve, the electric motor 142, and the like is the same as that of a normal mounting head, description thereof will be omitted, and hereinafter, a special control of the second linear motor 120 will be described.

Figure 4:
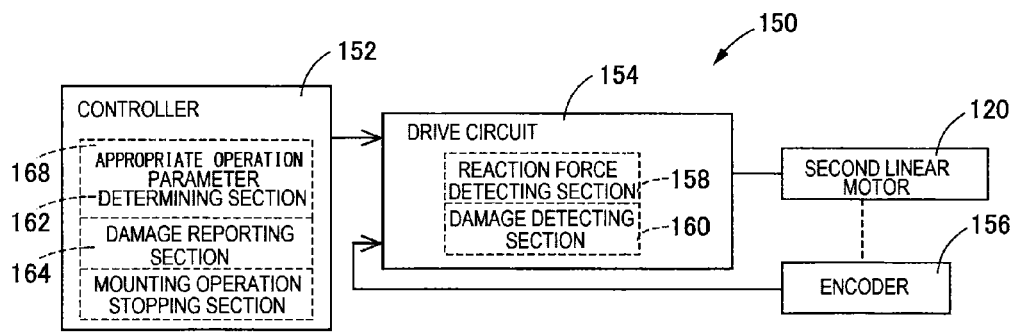
FIG. 4 is a block diagram illustrating a control system of the electronic circuit component mounting machine in the electronic circuit component mounting system.

The second linear motor 120 is controlled by a control system 150 illustrated in FIG. 4. The control system 150 is configured from a part of a controller 152 that controls the entirety of the mounting device 28 including the mounting head 30, a drive circuit 154, and an encoder 156 that comes with the second linear motor 120. The controller 152 designates the position of the second linear motor 120, and the drive circuit 154 supplies, to the second linear motor 120, a current that is necessary for making the designated position coincide with the position indicated by the encoder 156. At this time, the reaction force that is received by the second linear motor 120 is an elastic force of the compression coil springs 92 at first, but, after the suction nozzle 62 contacts the component 146 held by a component supplying device, or the component 146 held by the suction nozzle 62 contacts the mounting target member 22 held by the target member holding device 26 and the compression coil spring 116 is compressed, the second linear motor 120 receives the elastic force of the compression coil spring 116. That is, the set weight of the compression coil spring 116 is greater than the elastic force of the compression coil springs 92, the nozzle sleeve 114 integrally lowers with the suction nozzle 62 until the above contact is made, and after contact is made, the compression coil spring 116 starts elastic deformation and thereby the contact force is reduced. The set weight of the compression coil spring 116 is such that it does not by itself damage the component 146, and is such that the pressure of the component 146 on the mounting target member 22 has a sufficient magnitude, but, during contact, an inertial force of the suction nozzle 62 further operates in addition to a frictional force between the suction nozzle 62 and the nozzle sleeve 114, and if the inertial force is excessively increased, there is a possibility that a weak component 146 may become damaged. In other words, if the lowering speed of the suction nozzle 62 performed by the second linear motor 120 is sufficiently decreased, there is no possibility that the component 146 may be damaged by the set weight of the compression coil spring 116, but, if the lowering speed of the suction nozzle 62 is increased in order to increase mounting efficiency, there is a possibility that the inertial force of the suction nozzle 62 during contact is increased and thereby the component 146 may become damaged.

Damage can occur when manufacturing a surface mount board on which the component 146 is mounted on a single layer circuit board, but particularly in cases in which a component-embedded printed circuit board or a stacked printed circuit board is manufactured, the component 146 is a passive component such as a resistor or a capacitor, or the component 146 is an active component such as an IC, there are many cases in which the component 146 is thin, manufactured from a brittle material for ensuring electrical performance, and easily damaged. When manufacturing the component-embedded printed circuit board or the stacked printed circuit board, a printed circuit board is mounted on another printed circuit board, and thus with regard to the mounting target member 22 and the component 146, the component 146 is held by the suction nozzle 62 and mounted on the mounting target member 22, and there is no substantial difference between the component 146 and the mounting target member 22 in many cases.

Figure 5:
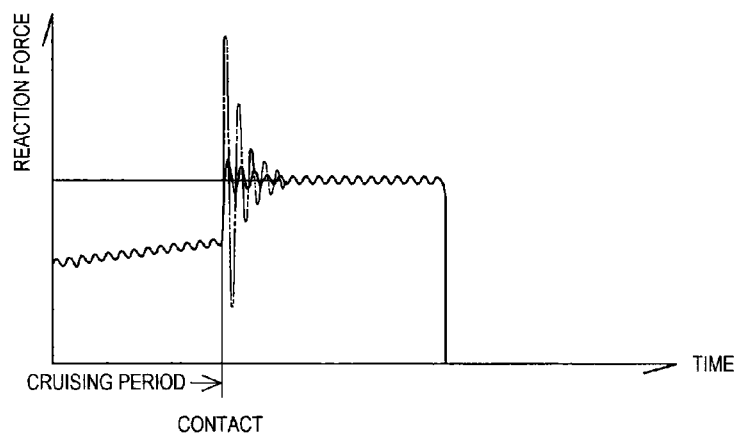
FIG. 5 is a graph illustrating the change of the reaction force with respect to a second linear motor, in which the solid line illustrates a case in which high frequency control is performed, and the two-dot chain line illustrates a case in which high frequency control is not performed, but normal control is performed.

As described above, the mounting head 30 of the embodiment is devised such that damage is avoided even in a case in which the component 146 is formed of a thin and brittle material and mounting work is performed efficiently. That is, when lowering the suction nozzle 62, first the first linear motor 58 is operated, then the lifting and lowering drive member 122 is lowered, and thereby the rotational lifting and lowering shaft 52 and the second linear motor 120 are lowered. The first linear motor 58 is operated mainly in order to satisfy the requirements in a case in which the lifting and lowering distance of the suction nozzle 62 is long, and before at least the component 146 contacts the suction nozzle 62 or the mounting target member 22, operation of the first linear motor 58 is stopped, the second linear motor 120 operates, and thereby the suction nozzle 62 is separated by a set distance from the lower end surface 100 that is a stopper against a biasing force of the compression coil springs 92. The cruising period in FIG. 5 is a period during which the suction nozzle 62 is lowered in that state.

Soon, the suction nozzle 62 contacts the component 146 held by a component supplying device, or the component 146 held by the suction nozzle 62 contacts the mounting target member 22 held by the target member holding device 26. If the second linear motor 120 and the control system 150 are not provided, and the compression coil spring 116 which functions as a cushion is provided in the same manner as a mounting head of the related art, a contact force during contact, that is, a reaction force against the suction nozzle 62 is rapidly increased, and thus the component 146 can be damaged; in addition, in a case in which the control of the control system 150 is not sufficient, the reaction force against the second linear motor 120 is greatly changed as illustrated by a two-dot chain line in FIG. 5, and furthermore, the component 146 can be damaged; however, in the present embodiment, the drive circuit 154 and the control system 150 are a system that can perform high-frequency control, that is, a high-frequency system in which a control cycle of at least two cycles can be performed before the contact force exceeds an allowable contact force and becomes excessive following the rapid increase of the reaction force due to the above contact, and, a reaction force detecting section 158 is provided in the drive circuit 154, and as soon as a detection force of the reaction force detecting section 158 rapidly increases in accordance with the above contact, the control system 150 starts control of the current supplied to the second linear motor 120 in order to control the reaction force so as to be a target reaction force. As a result, variation of the reaction force is suppressed so as to be decreased as denoted by the solid line, and during contact, the contact force is suppressed to a magnitude at which the component 146 is not damaged. A section in which the control system 150 performs the current control described above configures a contact impact absorbing section.

Figure 6:
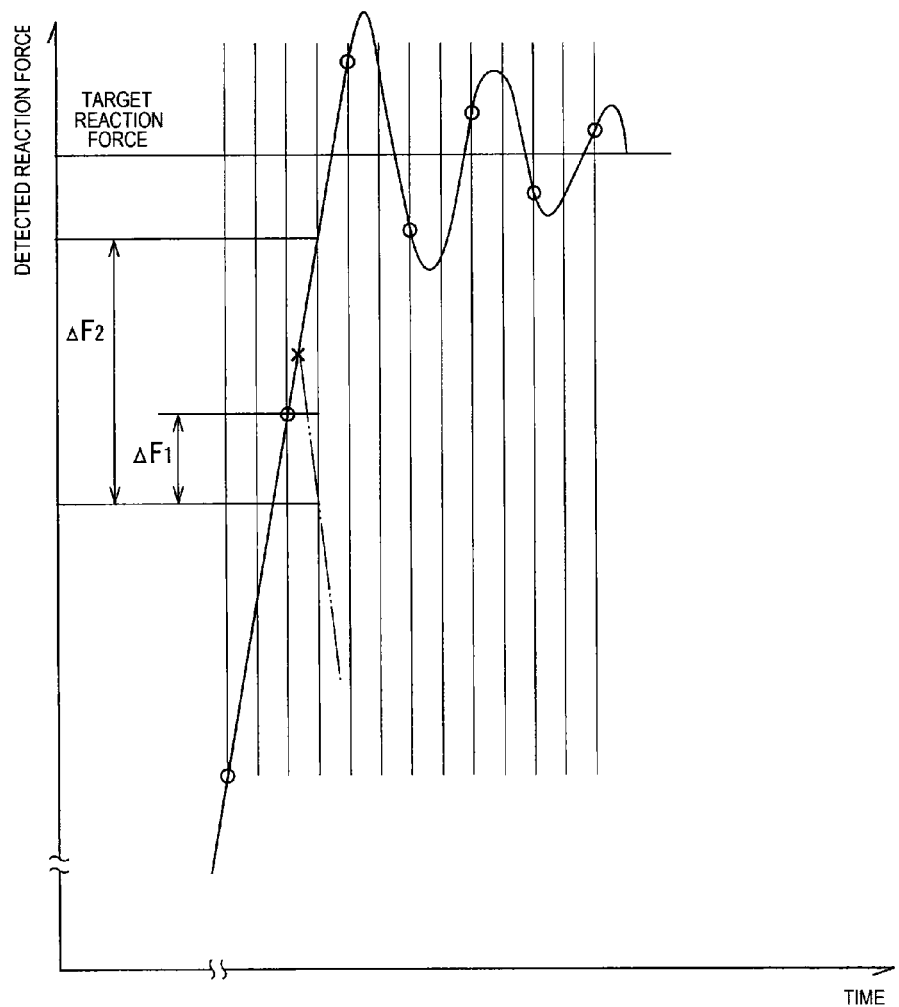
FIG. 6 is a graph in which, in a case in which the high frequency control illustrated in FIG. 5 is performed, a main portion of an example of a detected reaction force that is detected by a reaction force detecting section of the control system is illustrated in an enlarged manner, and in which the solid line illustrates the change of the detected reaction force when there is no damage, and the two-dot chain line illustrates the change of the detected reaction force when there is damage.
Figure 7:
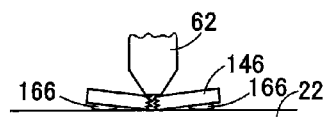
FIG. 7 is a view schematically illustrating a state in which a component is damaged when contacting a mounting target member.

For example, a load cell that is provided between the suction nozzle 62 and the second linear motor 120 can be employed as a main body portion of the reaction force detecting section 158, and in the present embodiment, as illustrated in FIG. 2, a load cell 159 that is provided between the second fitting section 126 and the second linear motor 120 is employed. A damage detecting section 160 that is a damage detecting device is provided, together with the reaction force detecting section 158, in the drive circuit 154. As described above, the detected reaction force that is detected by the reaction force detecting section 158 is rapidly increased in accordance with rapid increase in the reaction force against the second linear motor 120, which is caused by the contact of the suction nozzle 62 with the component 146, or by the contact of the component 146 held by the suction nozzle 62 with the mounting target member 22; however, if a portion that is rapidly increased is enlarged, and a horizontal axis which indicates time is elongated significantly more than a vertical axis which indicates reaction force and is illustrated, the result is as illustrated in FIG. 6, and eventually the detected reaction force is controlled so as to be the target reaction force, but, if the component 146 is damaged during this process as illustrated in FIG. 7, the detected reaction force rapidly decreases as denoted by a two-dot chain line of FIG. 6. In the present embodiment, damage to the component 146 is detected by the damage detecting section 160 detecting the rapid decrease of the detected reaction force. In a case in which an amount of rapid decrease of the detected reaction force is greater than a set value, it is defined that a rapid decrease of the reaction force is detected. In FIG. 6, a portion denoted by "o" indicates a control time point of a drive current, and a portion denoted by "X" indicates a damage time point of the component 146. In addition, the numeral 166 in FIG. 7 indicates cream solder.

Acquisition of the "amount of rapid decrease" of the reaction force can be performed by calculating the difference (denoted by $\Delta F_1$ in FIG. 6) between the detected reaction forces of two time points in which reaction force detection time points illustrated by a plurality of thin lines parallel to a vertical line in FIG. 6 are adjacent to each other, or can be performed by calculating the difference (denoted by $\Delta F_2$ in FIG. 6) between an expected reaction force at a subsequent time point that is expected based on the increase trend of the detected reaction force until the rapid decrease occurs, and the detected reaction force which is actually detected at the same time point. A determination section which determines that damage occurs in a case in which an amount of rapid decrease acquired by the former calculation method is equal to or greater than a set value can be considered as a type of "reaction-force-rapid-decrease-amount-dependent determination section which determines that the component 146 is damaged in a case in which the reaction force detected by the reaction force detecting section rapidly decreased by an amount equal to or more than a set value during increase of the reaction force"; a determination section which determines that damage occurs in a case in which an amount of rapid decrease acquired by the latter calculation method is equal to or greater than a set value can be considered as a type of "reaction-force-change-state-dependent-determination section which determines that the component is damaged in a case in which a change state of the reaction force detected by the reaction force detecting section is different from a set change state set in advance by a state equal to or more than a set state". The above-described "increase trend of the detected reaction force until the rapid decrease occurs" may be an increase gradient that is acquired based on a reaction force of two or more time points before the occurrence of damage during mounting in which damage actually occurs, and may be an average value of the increase gradient of the detected reaction force for a plurality of mounting processes that were performed in the past and for which damage did not occur.

The controller 152 includes a damage reporting section 162 that reports the fact that component damage has been detected in a case in which damage of a component has been detected by the damage detecting section 160, and a mounting operation stopping section 164 that stops a mounting operation of the mounting machine 10. The damage reporting section 162 is a section that displays a damage occurrence on a display which is not illustrated. The mounting operation stopping section 164 stops the operation of the section that performs a mounting operation, such as the head moving device 32, the first linear motor 58, or the second linear motor 120, but does not stop the operation of the controller 152, a display or the like. If the operation of the section that performs the mounting operation is stopped, an operator can know that some kind of problem has occurred, thus the mounting operation stopping section 164 can also be used as a damage reporting section; however, there are various other mounting device 28 problems in addition to the damage of the component 146, thus it is preferable that, together with the operation stop, it is reported that the problem was caused by the damage of the component 146.

The controller 152 further includes an appropriate operation parameter determining section 168 that determines appropriate operation parameter using the reaction force detecting section 158 and the damage detecting section 160 for when the suction nozzle 62 contacts the component 146, or when the component 146 held by the suction nozzle 62 contacts the mounting target member 22. The appropriate operation parameter determining section 168 determines an appropriate operation parameter by executing an appropriate operation parameter determination routine illustrated in the flowchart of FIG. 8, with regard to a combination of various types of a component supplying device (the tape feeders 14 and the tray feeders 16 in the present embodiment) and various types of the component 146, and a combination of various types of the target member holding device 26 and the mounting target member 22 and various types of the component 146. If the mounting target member 22 is coated with solder 166 in the form of a cream, or adhesive, the mounting target member 22 includes the coating materials. This is because the coating materials can also affect the damage of the component 146.

When executing the appropriate operation parameter determination routine, first, in S1, any one of the combinations for which to determine an appropriate operation parameter is input; in S2, an expected appropriate contact force $F_0$ with regard to the component 146 included in the combination is input. An expected value based on the past experience or the like of a user using the mounting system is used as the expected appropriate contact force $F_0$, but in a case in which there is none, a value of a recommended contact force that is recommended by a component manufacturer is used. Subsequently, in S3, an expected appropriate lowering speed $V_0$ of the suction nozzle 62 is determined as a type of expected appropriate operation parameter. In general, the lower the lowering speed of the suction nozzle 62 is, the smaller the contact force is, thus in the present embodiment, in S2, the smaller the expected appropriate contact force $F_0$ that is input, the lower the expected appropriate lowering speed $V_0$ value that is determined. For example, the speed $V_0$ is calculated by an equation $V_0=a*F_0$. Here, a is a proportional coefficient, but for the same components 146, the higher the rigidity of a supporting surface of a component supplying device that holds the component 146, the higher the rigidity of the mounting target member 22 that contacts the component 146, or the higher the rigidity of the supporting surface of the target member holding device 26 that holds the mounting target member 22, the larger the force generated by a small lowering speed, thus, it is preferable that the proportional integer a is changed depending on the above rigidities. The component supplying device and the target member holding device 26 have an elastic deformation capability, albeit small; in addition, the mounting target member 22 usually has significant deformation capability (deformation capability of at least one of elasticity and plasticity) (particularly, in a case in which the solder 166 in the form of a cream, or adhesive is applied), thus the deformation capability of the elasticity or the plasticity has a function of cushioning that reduces the contact force.

Subsequently, in S4, an initial lowering speed $V_i$ is calculated by an equation $V_i=b*V_0$. Here, b is an integer smaller than 1 and is a predetermined coefficient; for example, in a case in which the initial lowering speed $V_i$ is intended to be set to half of the expected appropriate lowering speed $V_0$, b is set to 0.5. Next, in S5, an increased amount of the lowering speed $\Delta V$ is calculated by $\Delta V=(V_0-V_i)/s$. The symbol s represents the number of stages for a lowering speed V to gradually increase from the initial lowering speed $V_i$ to the expected appropriate lowering speed $V_0$, and is determined in advance. After a positive integer N is initialized to 1 in S6, test execution is performed once in S7. In a case in which the tape feeders 14 or the tray feeders 16 are included in the combination that is input in S1, making the suction nozzle 62 contact the component 146 that is supported by the tape feeders 14 or the tray feeders 16, or in a case in which the mounting target member 22 is included in the combination, making the component 146 held by the suction nozzle 62 contact the mounting target member 22 held by the target member holding device 26, is executed once with the lowering speed V (initially, with the initial lowering speed $V_i$ that is determined in S4) at each time point. After the test execution, it is determined whether damage is detected in S8, but since the initial lowering speed $V_i$ is set to a sufficiently small value, the component 146 is not damaged, the determination is NO, the lowering speed V is increased by $\Delta V$ in S9, and S7 is executed again. After that, S7 to S9 are repeatedly executed, and if the determination of S8 is YES, in S10, the lowering speed at the time point is stored in a lowering speed memory at the time of damage detection as the lowering speed $V_b$ at the time of damage detection that is a type of an operation parameter at the time of the damage detection. The lowering speed $V_b$ at the time of the damage detection is a type of boundary lowering speed that is an operation parameter of a boundary between a case in which the damage of the component 146 is detected by the damage detection device and a case in which the damage is not detected; however, it is also possible to set an intermediate value between the lowering speed $V_b$ at the time of the damage detection and the lowering speed in a case immediately before the damage was detected, in which the damage is not detected, as the boundary lowering speed.

In S10 described above, it is possible to determine the appropriate lowering speed based on the lowering speed $V_b$ at the time of damage detection of one piece stored in the lowering speed memory at the time of damage detection; however, in the present embodiment, for the sake of reliability, S7 to S9 are executed $N_0$ times. In S11, a positive integer N is increased by 1, and in S13, the lowering speed V returns to the initial lowering speed $V_i$. Then, S7 to S13 are repeatedly executed, until the positive integer N reaches $N_0$ and thereby the determination of S12 becomes YES. As a result, when the determination of S12 becomes YES, the lowering speeds $V_b$ at the time of damage detection of $N_0$ pieces are stored in the lowering speed memory at the time of damage detection, and in S14, the appropriate lowering speed is determined based on the lowering speeds at the time of damage detection of the $N_0$ pieces. The determination can be performed by various methods, but in the present embodiment, the appropriate lowering speed is determined by dividing an average value of the lowering speeds $V_b$ at the time of damage detection of the $N_O$ pieces by a safety rate c.

The safety rate c is also a value higher than 1, and it is preferable that the safety rate is set to a greater value the greater the variation is for the lowering speeds at the time of damage detection of the $N_O$ pieces.

In addition, it is also possible to determine the appropriate lowering speed as a value smaller than any one of the lowering speeds $V_b$ at the time of damage detection of the $N_O$ pieces, or as a value greater than the smallest lowering speed $V_b$ at the time of damage detection. In a case of the former, while the damage of the component 146 can be efficiently avoided during manufacture of an actual electronic circuit later, manufacturing capability may be excessively decreased. In a case of the latter, in contrary to this, while an excessive decrease of manufacturing capability can be avoided, damage of the component 146 may be generated during manufacture of an actual electronic circuit. Based on the magnitude or the like of the damage in a case in which the component 146 is damaged, the positive integer $N_O$ (the number of acquisition of the lowering speed $V_b$ at the time of damage detection) and safety rate c have to be determined by considering which outcome is actually desirable.

As is apparent from the above description, in the present embodiment, the lifting and lowering device which lifts and lowers the suction nozzle 62 that is a component holding tool is configured by the first linear motor 58, the second linear motor 120, the lifting and lowering drive member 122, and the like; and a boundary lowering speed acquiring section that acquires boundary lowering speed that is a boundary operation parameter is configured by a section that executes S7 to S10 of the appropriate operation parameter determination routine, or a section that executes S6 to S13. In addition, an appropriate lowering speed determining section which determines the appropriate lowering speed that is a type of the appropriate operation parameter based on the boundary lowering speed acquired by the boundary lowering speed acquiring section is configured by a section that executes S14.

Figure 9:
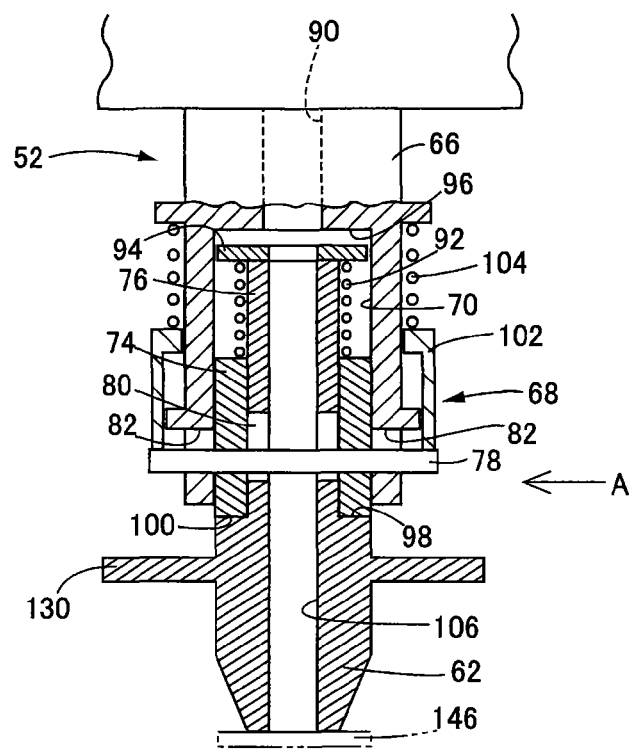
FIG. 9A and FIG. 9B are views corresponding to FIG. 3A and FIG. 3B illustrating another example of the mounting head of the electronic circuit component mounting machine.
Figure 9:
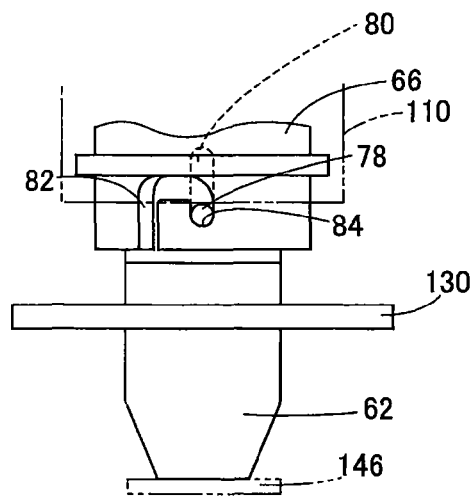

In the embodiment, the compression coil spring 116 is provided between the second linear motor 120 and the suction nozzle 62, and the component 146 can be prevented from being damaged by the set weight and the elastic coefficient of the compression coil spring 116 being appropriate magnitudes if the lowering speed of the suction nozzle 62 by the second linear motor 120 is set appropriately; however, as illustrated in FIG. 9A and FIG. 9b, it is also possible to omit the compression coil spring between the second linear motor 120 and the suction nozzle 62. In this case, the second fitting section 126 of the second linear motor 120 is directly fit to the suction nozzle 62, for example, is fit to the flange 130 that is a part of the suction nozzle 62.

In the present embodiment, as soon as the contact of the suction nozzle 62 with the component 146 supported by the component supplying device, or the contact of the component 146 held by the suction nozzle 62 with the mounting target member 22 supported by the target member holding device 26, is detected, conversion from a lowering control of the suction nozzle 62 to a lifting control thereof is performed. Also, the lowering speed of the suction nozzle 62 is variously changed, the contact is repeatedly performed, and the boundary lowering speed that is the lowering speed of the boundary between a case in which the damage of the component 146 is detected and a case in which the damage thereof is not detected, is acquired. Also, in the present embodiment, the lowering speed of the suction nozzle 62 is an operation parameter that has to be controlled to efficiently perform manufacture of a circuit board while avoiding the damage of the component 146.

However, in order to detect the contact, it is required to detect that an increase of the reaction force against the suction nozzle 62 exceeds a set increase, and the increase can be considered as a type of an operation parameter; considering this, in the present embodiment, both the appropriate lowering speed of the suction nozzle 62 and the increase of the reaction force are appropriate operation parameters.

In the embodiment described above, the load cell 159 is used for detecting the reaction force against the second linear motor 120, but in a case in which the control for the operation of the second linear motor 120 is performed by the drive circuit 154 in accordance with the command from the controller 152, if the reaction force against the second linear motor 120 increases, a drive current of the second linear motor 120 increases, and thus it is possible to configure such that the reaction force against the second linear motor 120 is detected based on the drive current. Thus, since an increase or a decrease of the drive current can be performed by the drive circuit 154 and the increase of the drive current can also be detected by the drive circuit 154, there are advantages in which, based on a rapid increase of the reaction force against the second linear motor 120, the contact of the suction nozzle 62 with the component 146 or the mounting target member 22 can be detected at a small delay, and the control of the contact force performed by the second linear motor 120 can also be performed at a small delay.

In the present embodiment, the drive current of the second linear motor 120 is at least one of the operation parameters that have to be controlled for efficiently performing manufacture of a circuit board while avoiding the damage of the component 146, and the appropriate drive current that is a drive current which has to be used to detect the contact and to be converted from a lowering control to a lifting control of the suction nozzle 62 is an appropriate operation parameter.

Figure 10:
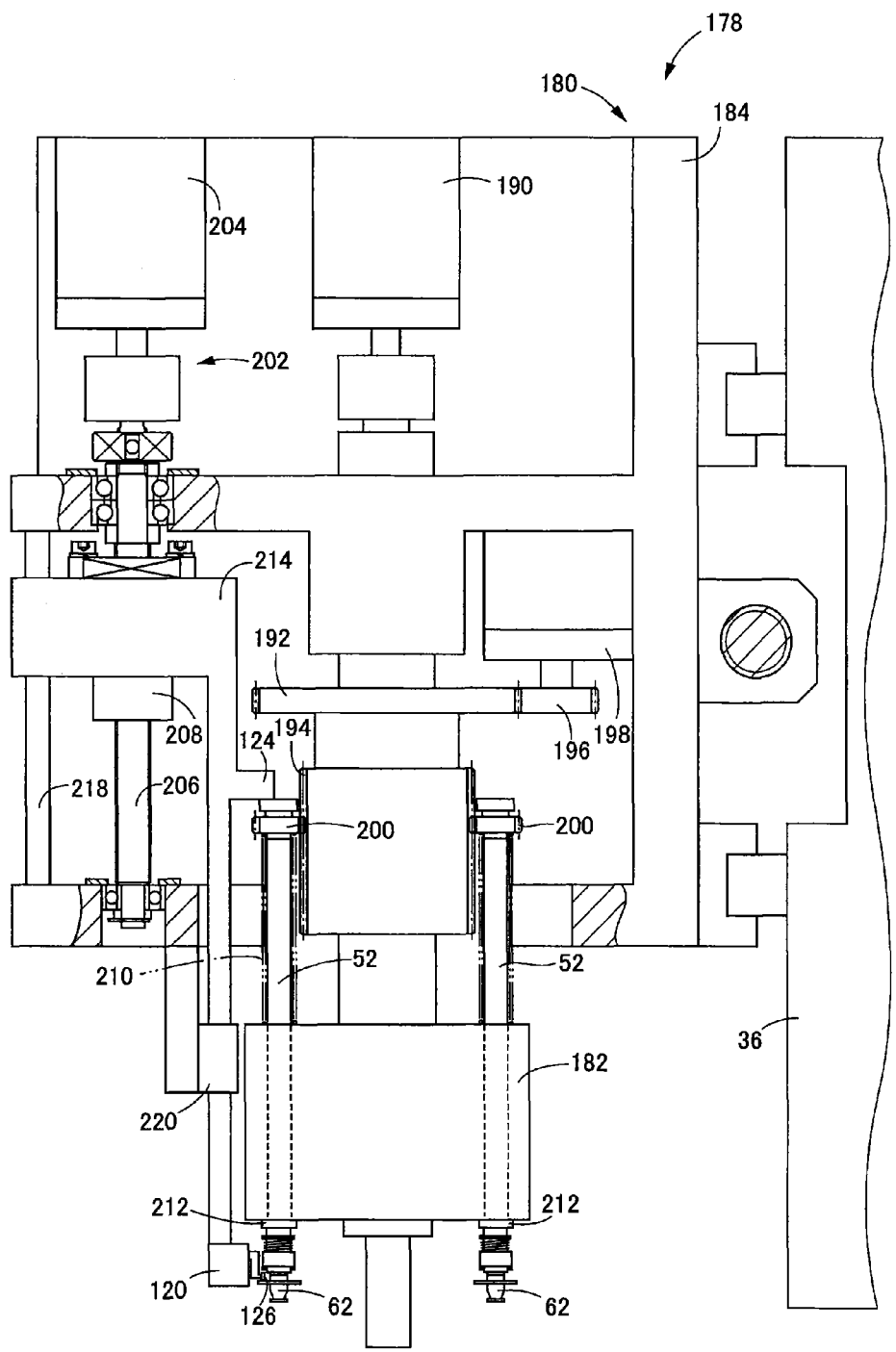
[FIG. 10 is a front view illustrating still another example of the mounting head according to another embodiment of the present disclosure.

In addition, in the embodiment described above, the mounting head 30 includes one suction nozzle 62 that is a component holding tool, and the first section 54 and the second section 60 of the head body 50 are fixed to each other; however, the mounting head 30 may include a plurality of the suction nozzles 62, and may also be configured such that the first section and the second section can relatively move. For example, a mounting head 178 is configured as illustrated in FIG. 10, and a head body 180 is configured by two sections, which can be relatively moved to each other, that is, a rotor 182 which is a first section that is rotatable around one axis line, and a Y slide 184 which is a second section that rotatably hold the rotor 182.

The rotational lifting and lowering shaft 52 is slidably and rotatably provided in a direction parallel to a rotational axis line at a plurality of positions of equal angular intervals on one circumference having a rotational axis line of the rotor 182 as a center, that is, six positions in the illustrated example. The rotor 182 is rotated by a rotor rotation drive motor 190. In addition, integral gears 192 and 194 are relatively and rotatably fit to the rotor 182 on the outer circumference of the rotor 182, are rotated by a nozzle rotation drive motor 198 via a pinion 196, and simultaneously rotate a plurality of the rotational lifting and lowering shafts 52 and the suction nozzles 62 via a plurality of pinions 200.

One of the plurality of rotational lifting and lowering shafts 52, which is revolved to a component receiving and mounting position by the rotation of the rotor 182 is lifted and lowered by a first lifting and lowering drive device 202. In the present embodiment, the first lifting and lowering drive device 202 is configured by a lifting and lowering drive motor 204 that is a rotation motor, a feed screw 206, and a nut 208. In addition, the rotational lifting and lowering shaft 52 is biased in an upper direction by a compression coil spring 210, and a snap ring 212 that is attached to the vicinity of a lower end of the rotational lifting and lowering shaft 52 is held in a lifting and lowering limitation position by being in contact with a lower surface of the rotor 182. Thus, a first fitting section 124 of a lifting and lowering drive member 214 is fit to an upper end surface of the rotational lifting and lowering shaft 52, and lowers the rotational lifting and lowering shaft 52 against the biasing force of the compression coil spring 210. The lifting and lowering drive member 214 guides lifting and lowering using a guide rod 218 and a guide 220.

Also, in the present embodiment, the rotational lifting and lowering shaft 52 and the second linear motor 120 are lifted and lowered together by the first lifting and lowering drive device 202, and furthermore, the second linear motor 120 that is a second lifting and lowering drive device lifts and lowers the suction nozzle 62 with respect to the rotational lifting and lowering shaft 52, such that contact impact is mitigated when the suction nozzle 62 contacts the component 146, and when the component 146 held by the suction nozzle 62 contacts the mounting target member 22. In addition, a point in which the first fitting section 124 and the second fitting section 126 are fit to the rotational lifting and lowering shaft 52 and the suction nozzle 62 in a state of allowing the rotation thereof is the same as that of the above embodiment, but the present embodiment further allows fitting and separation in a direction orthogonal to the lifting and lowering direction of the rotational lifting and lowering shaft 52 and the suction nozzle 62 according to the rotation of the rotor 182.

Also, in the present embodiment, control of the second linear motor 120, damage detection of the component 146, determination of a set increase of a reaction force that determines an appropriate lowering speed of the suction nozzle 62 and a conversion period from a lowering control to a lifting control of the suction nozzle 62, or the like is the same as that of the above embodiment.

Figure 8:
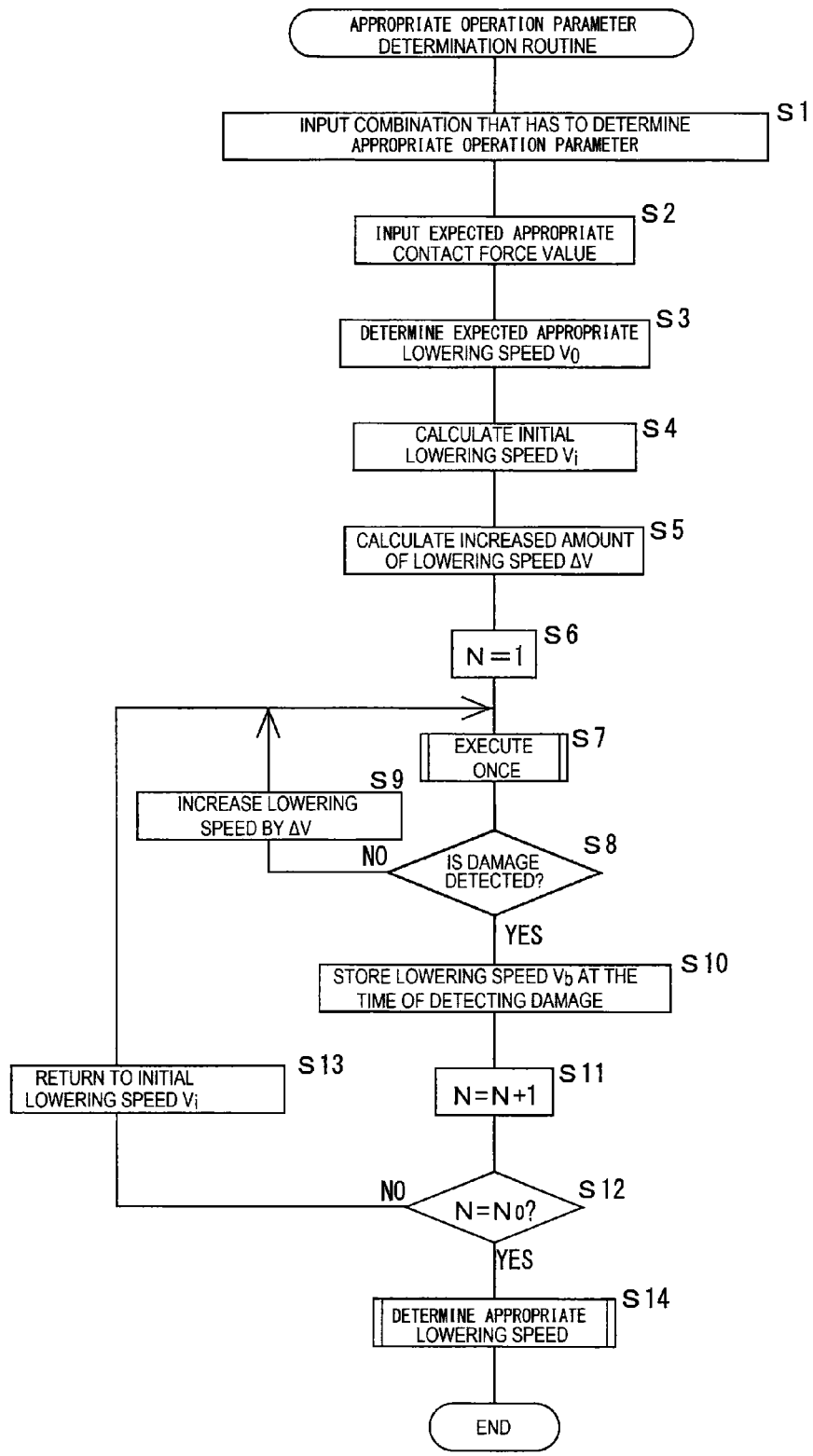
FIG. 8 is a flowchart illustrating an appropriate operation parameter determination routine that is performed by a controller of the control system.

However, in the mounting head 178 illustrated in FIG. 10, the suction nozzle 62 and the periphery thereof are configured as illustrated in FIG. 3A and FIG. 3B, and it is also possible for the determination of an appropriate operation parameter that has to be controlled to efficiently perform manufacture of a circuit board while avoiding the damage of the component 146 to be performed by execution of the appropriate operation parameter determination routine illustrated in FIG. 8.

REFERENCE SIGNS LIST

10: ELECTRONIC CIRCUIT COMPONENT MOUNTING MACHINE (MOUNTING MACHINE), 14: TAPE FEEDER, 16: TRAY FEEDER, 22: MOUNTING TARGET MEMBER, 26: TARGET MEMBER HOLDING DEVICE, 28: MOUNTING DEVICE, 30: MOUNTING HEAD, 50: HEAD BODY, 52: ROTATIONAL LIFTING AND LOWERING SHAFT, 58: FIRST LINEAR MOTOR, 62: SUCTION NOZZLE, 68: NOZZLE HOLDING PORTION, 74: NOZZLE HOLDING MEMBER, 120: SECOND LINEAR MOTOR, 150: CONTROL SYSTEM, 152: CONTROLLER, 154: DRIVE CIRCUIT, 156: ENCODER, 158: REACTION FORCE DETECTING SECTION, 160: DAMAGE DETECTING SECTION, 162: DAMAGE REPORTING SECTION, 164: MOUNTING OPERATION STOPPING SECTION, 168: APPROPRIATE OPERATION PARAMETER DETERMINING SECTION

The invention claimed is:

1. An electronic circuit component mounting system comprising:
 a component supplying device that supplies an electronic circuit component;
 a target member holding device that holds a mounting target member to which the electronic circuit component is to be mounted;
 a mounting device that includes a component holding tool which holds the electronic circuit component and includes a lifting and lowering device which lifts and lowers the component holding tool, the mounting device receives the electronic circuit component from the component supplying device using the component holding tool, and mounts the electronic circuit component on the mounting target member held by the target member holding device; and
 a damage detecting device that detects that the electronic circuit component is damaged in at least one of when the component holding tool contacts the electronic circuit component by the component holding tool being lowered by the lifting and lowering device, and when the electronic circuit component held by the component holding tool contacts the mounting target member by the component holding tool being lowered by the lifting and lowering device, the damage detection device including a reaction force detecting section that detects a reaction force against the component holding tool in at least one of when the component holding tool contacts the electronic circuit component, and when the electronic circuit component held by the component holding tool contacts the mounting target member,
 wherein the reaction force detecting section includes a drive source current detecting section that detects a current of a drive source of the lifting and lowering device as an amount corresponding to the reaction force against the component holding tool.

2. The electronic circuit component mounting system according to claim 1,
 wherein the damage detection device includes
 a damage determining section that determines presence or absence of damage of the electronic circuit component based on a changed state of the reaction force detected by the reaction force detecting section.

3. The electronic circuit component mounting system according to claim 2, wherein the reaction force detecting section includes a reaction force sensor that is disposed between a drive source of the lifting and lowering device and the component holding tool, and that detects the reaction force which is applied to the drive source from the component holding tool.

4. The electronic circuit component mounting system according to claim 2, wherein the damage determining section includes a reaction-force-change-state-dependent determination section which determines that the electronic circuit component is damaged in a case in which a changed state of the reaction force detected by the reaction force detecting section is different from a set change state which is set in advance.

5. The electronic circuit component mounting system according to claim 1, further comprising: a damage reporting section which reports that damage of the electronic circuit component has been detected by the damage detecting device, and
a mounting operation stopping section that, in a case in which damage of the electronic circuit component has been detected by the damage detecting device, stops a mounting operation of the electronic circuit component which is performed by the electronic circuit component mounting system.

6. The electronic circuit component mounting system according to claim 1, further comprising: a damage reporting section which reports that damage of the electronic circuit component has been detected by the damage detecting device.

7. The electronic circuit component mounting system according to claim 1, further comprising: a mounting operation stopping section that, in a case in which damage of the electronic circuit component has been detected by the damage detecting device, stops a mounting operation of the electronic circuit component which is performed by the electronic circuit component mounting system.

8. An electronic circuit component mounting system comprising:
a component supplying device that supplies an electronic circuit component;
a target member holding device that holds a mounting target member to which the electronic circuit component is to be mounted;
a mounting device that includes a component holding tool which holds the electronic circuit component and includes a lifting and lowering device which lifts and lowers the component holding tool, the mounting device receives the electronic circuit component from the component supplying device using the component holding tool, and mounts the electronic circuit component on the mounting target member held by the target member holding device; and
a damage detecting device that detects that the electronic circuit component is damaged in at least one of when the component holding tool contacts the electronic circuit component by the component holding tool being lowered by the lifting and lowering device, and when the electronic circuit component held by the component holding tool contacts the mounting target member by the component holding tool being lowered by the lifting and lowering device,
wherein the damage detection device includes
a reaction force detecting section that detects a reaction force against the component holding tool in at least one of when the component holding tool contacts the electronic circuit component, and when the electronic circuit component held by the component holding tool contacts the mounting target member; and
a damage determining section that determines presence or absence of damage of the electronic circuit component based on a changed state of the reaction force detected by the reaction force detecting section,
wherein the damage determining section includes a reaction-force-change-state-dependent determination section which determines that the electronic circuit component is damaged in a case in which a changed state of the reaction force detected by the reaction force detecting section is different from a set change state which is set in advance, and
wherein the reaction-force-change-state-dependent determination section includes a reaction-force-rapid-decrease-dependent determination section which determines that the electronic circuit component is damaged in a case in which the reaction force detected by the reaction force detecting section rapidly decreases by an amount equal to or more than a set amount during an increase of the reaction force.

9. An electronic circuit component mounting system comprising:
a component supplying device that supplies an electronic circuit component;
a target member holding device that holds a mounting target member to which the electronic circuit component is to be mounted;
a mounting device that includes a component holding tool which holds the electronic circuit component and includes a lifting and lowering device which lifts and lowers the component holding tool, the mounting device receives the electronic circuit component from the component supplying device using the component holding tool, and mounts the electronic circuit component on the mounting target member held by the target member holding device;
a damage detecting device that detects that the electronic circuit component is damaged in at least one of when the component holding tool contacts the electronic circuit component by the component holding tool being lowered by the lifting and lowering device, and when the electronic circuit component held by the component holding tool contacts the mounting target member by the component holding tool being lowered by the lifting and lowering device; and
a damage operation parameter acquiring section that acquires an operation parameter in a case in which damage of the electronic circuit component is detected by the damage detecting device when an operation of making the electronic circuit component held by the component holding tool contact the mounting target member held by the target member holding device is repeatedly performed while changing, in accordance with a predetermined rule, the operation parameter,
wherein the operation parameter is a parameter of the operation with respect to the target member holding device, the electronic circuit component, and the mounting target.

10. An electronic circuit component mounting system comprising:
a component supplying device that supplies an electronic circuit component;
a target member holding device that holds a mounting target member to which the electronic circuit component is to be mounted;
a mounting device that includes a component holding tool which holds the electronic circuit component and includes a lifting and lowering device which lifts and lowers the component holding tool, the mounting device receives the electronic circuit component from the component supplying device using the component holding tool, and mounts the electronic circuit component on the mounting target member held by the target member holding device;
a damage detecting device that detects that the electronic circuit component is damaged in at least one of when the component holding tool contacts the electronic circuit component by the component holding tool being lowered by the lifting and lowering device, and when the electronic circuit component held by the component holding tool contacts the mounting target member by the component holding tool being lowered by the lifting and lowering device; and a damage operation parameter acquiring section that acquires an operation parameter in a case in which damage of the electronic circuit component is detected by the damage detecting device when an operation of making the component holding tool contact the electronic circuit component held by the component supplying device is repeatedly performed while changing, in accordance with a predetermined rule, the operation parameter, wherein the operation parameter is a parameter of the operation with respect to the component supplying device and the electronic circuit component.

* * * * *